(12) United States Patent
Schneider et al.

(10) Patent No.: US 11,792,966 B2
(45) Date of Patent: Oct. 17, 2023

(54) FLEXIBLE LAMINATE FOR SHIELDING ELECTROMAGNETIC RADIATION

(71) Applicant: Carl Freudenberg KG, Weinheim (DE)

(72) Inventors: Ulrich Schneider, Darmstadt (DE); Sarah Senne, Heddesheim (DE); Michael Zaplatilek, Birkenau (DE)

(73) Assignee: CARL FREUDENBERG KG, Weinheim (DE)

( * ) Notice: Subject to any disclaimer, the term of this patent is extended or adjusted under 35 U.S.C. 154(b) by 0 days.

(21) Appl. No.: 17/778,009

(22) PCT Filed: Nov. 9, 2020

(86) PCT No.: PCT/EP2020/081481
§ 371 (c)(1),
(2) Date: May 19, 2022

(87) PCT Pub. No.: WO2021/099163
PCT Pub. Date: May 27, 2021

(65) Prior Publication Data
US 2022/0418173 A1    Dec. 29, 2022

(30) Foreign Application Priority Data
Nov. 21, 2019   (DE) ............... 10 2019 131 499.2

(51) Int. Cl.
*H05K 9/00*        (2006.01)
*H01Q 17/00*       (2006.01)

(52) U.S. Cl.
CPC .......... *H05K 9/0084* (2013.01); *H01Q 17/008* (2013.01); *H05K 9/009* (2013.01); *H05K 9/0086* (2013.01); *H05K 9/0088* (2013.01)

(58) Field of Classification Search
CPC ........................... H05K 9/0086; H01Q 17/008
See application file for complete search history.

(56) References Cited

U.S. PATENT DOCUMENTS

| | | | | |
|---|---|---|---|---|
| 4,891,468 A | * | 1/1990 | Andrae | H05K 9/0086 342/4 |
| 4,952,448 A | * | 8/1990 | Bullock | H01B 1/24 428/323 |
| 5,455,116 A | * | 10/1995 | Nagano | H05K 9/0086 428/545 |

(Continued)

FOREIGN PATENT DOCUMENTS

DE   102005001063 A1   7/2006
DE   102012206549 A1   10/2013
(Continued)

*Primary Examiner* — Hung V Ngo (74) *Attorney, Agent, or Firm* — LEYDIG, VOIT & MAYER, LTD.

(57) ABSTRACT

A flexible laminate for shielding against electromagnetic radiation includes: a) at least one metal foil; and b) a sheet-like substrate made of a fiber material, film material, or foam material. The laminate includes a plurality of objects formed by incisions into a base area of the laminate. Each object of the plurality of objects is made of two or more incisions having a common initial point. The two or more incisions, or each of two adjacent incisions of the two or more decisions, define an angle of 45° to 160°.

23 Claims, 3 Drawing Sheets

(56) References Cited

U.S. PATENT DOCUMENTS

| | | | |
|---|---|---|---|
| 9,306,290 B1* | 4/2016 | Grop | H01Q 15/24 |
| 10,062,477 B1 | 8/2018 | Kagawa | |
| 2006/0151208 A1 | 7/2006 | Greiser | |
| 2009/0027300 A1* | 1/2009 | Kudo | H05K 9/0003 |
| | | | 343/912 |
| 2011/0008580 A1 | 1/2011 | Kagawa et al. | |
| 2013/0027826 A1 | 1/2013 | Lin et al. | |
| 2013/0285846 A1 | 10/2013 | Kagawa | |
| 2014/0360771 A1 | 12/2014 | Itani et al. | |
| 2019/0162486 A1* | 5/2019 | Cohen | G02B 1/002 |

FOREIGN PATENT DOCUMENTS

| | | |
|---|---|---|
| EP | 0998182 A2 | 5/2000 |
| JP | H11243292 A | 9/1999 |
| JP | 2010140875 A | 6/2010 |
| JP | 2018198254 A | 12/2018 |
| WO | WO 2008127077 A1 | 10/2008 |
| WO | WO 2008130201 A2 | 10/2008 |
| WO | WO 2016169948 A1 | 10/2016 |

* cited by examiner

FLEXIBLE LAMINATE FOR SHIELDING ELECTROMAGNETIC RADIATION

CROSS-REFERENCE TO PRIOR APPLICATIONS

This application is a U.S. National Phase application under 35 U.S.C. § 371 of International Application No. PCT/EP2020/081481, filed on Nov. 9, 2020, and claims benefit to German Patent Application No. DE 10 2019 131 499.2, filed on Nov. 21, 2019. The International Application was published in German on May 27, 2021 as WO 2021/099163 under PCT Article 21(2).

FIELD

The present invention relates to a flexible laminate for shielding against electromagnetic radiation, a method for producing a component shielded against electromagnetic radiation, the components obtained by this method, and the use of the flexible substrate for shielding against electromagnetic radiation.

BACKGROUND

Electromagnetic waves have an electric and a magnetic field component. The waves radiated by electronic components, whether power-conducting or those used for power storage, can lead to electromagnetic interference (EMI). Due to the huge progress in semiconductor technology, the electronic components have become increasingly smaller, and their density within electronic devices has increased substantially. The increasing complexity of electronic systems, for example in fields such as electric mobility, aerospace technology, medical technology or entertainment electronics, presents huge challenges for the electromagnetic compatibility of the individual components. In electric vehicles, for example, electric drives of high power are integrated within very little space and controlled by electronic components. For storing and supplying electrical energy, lithium-ion batteries are used in many areas with the attendant control electronics. It has to be ensured that there is absolutely no mutual interference between the individual components. To achieve electromagnetic compatibility, it has been known to dampen electromagnetic influence with the aid of shielding housings. The term electromagnetic compatibility (EMC) has been defined, for example, in accordance with DIN VDE 0870 as the ability of an electrical device to function acceptably in its environment without unduly influencing this environment, to which other devices can also belong. Thus, EMC has to fulfil two conditions: shielding the emitted radiation and interference resistance with respect to other electromagnetic radiation. In many countries, the devices in question have to fulfil regulatory requirements. The electromagnetic influence (EMI), in accordance with DIN VDE 0870 is the influence of electromagnetic waves on electric circuits, devices, systems or animals. Such influence can lead to acceptable, but also to unacceptable effects on, for example, the functioning of devices or risk to persons. In such cases, corresponding protective measures have to be in place. The frequency range relevant for EMI shielding is generally between 100 Hz and 100 GHz, especially from about 10 MHz to 10 GHz.

The electromagnetic compatibility of the components and energy saving and thermal management are the challenges for successful electric mobility technology. The use of modern brushless electric motors and all sorts of control units require the provision of electric power in the form of alternating and three-phase current. The electronic components emit undesirable magnetic, electric and electromagnetic waves of different frequencies which on the one hand can be a source of interference for other control units or, on the other hand, the control unit itself is interfered with by the waves emitted by other components.

It has been known to electromagnetically shield electronic components with housings of metal, e. g. aluminum, so that they do not negatively affect each other in their functionality. The use of purely metallic shields, however, is associated with all manner of drawbacks, such as the high material weight and the cumbersome manufacture by means of punching, bending and the application of corrosion protection, which involves high cost. The structural design choices are also very limited with metallic materials. Shieldings made of plastic are much more easily brought into any desired shape than metals. Since most plastics are dielectric, they can be provided with the requisite conductivity by, for example, electroplating or physical vapor deposition (PVD). Alternatively, it has been known to use laminated materials comprising at least one plastic- and/or fiber-containing layer and at least one aluminum layer. A drawback with these laminated materials is that their ability to be deformed in three dimensions without mechanical damage, especially crack formation, is very limited.

For electromagnetically shielding computer monitors it has also been known to use a transparent substrate having a lattice printed on it of an electromagnetically shielding material with thin, widely spaced lattice lines. EP 0998182 A2 (DE 69923142 T2) describes an electromagnetic shielding plate which can be mounted on a computer monitor as a front plate to shield against electromagnetic radiation which emanates from the front surface of the computer monitor. The electromagnetic shielding is achieved by a conductive lattice in which the individual lattice lines must be formed to be sufficiently thin and must have sufficient spacing so that the lattice lines are as invisible as possible. To create the lattice pattern, a conductive paste is printed, for example, on a glass plate.

DE 102005001063 A1 describes a laminated material for shielding against electromagnetic waves, especially in buildings. The laminated material comprises at least one fiber-comprising layer and at least one aluminum layer. The fiber-comprising layer can be fabrics, knitted fabrics, fiber layings, fiber bundles and preferably fiber nonwoven fabrics. It is described that both the aluminum layer and the fiber-comprising layer can be provided with a perforation so that adhesive and bitumen can better soak into the material and gas can escape. As described elsewhere, the aluminum layer can have a stretchability in at least one direction in the range of 2 to 35% in relation to the length of the fiber-comprising layer in this direction. There is no teaching of applying the perforation in order to improve stretchability.

WO 2008/130201 A2 teaches the use of a laminate for shielding against electromagnetic waves, which comprises a polymer resin layer and at least one metal foil layer. This laminate is said to have good tensional stability and flexibility compared with pure metal foils. Embodiments of the invention relate to laminates in which one surface or both surfaces have embossed regions or laminates having perforated regions. The diameter of the perforated regions is preferably in the range of 10 μm to 5 mm. This is therefore a case of creating holes having a certain diameter in the laminate, i. e. punching, involving the removal of material from the laminate. The embossed and/or perforated regions are said to provide the laminate with a certain flexibility, comparable to a metal mesh. Again, this document teaches neither to provide the laminate with incisions to improve its flexibility, at least in the metal foil, nor that the geometry of these incisions can have an influence on the mechanical properties.

WO 2008/127077 A1 describes a heat-conductive laminated material for shielding against electromagnetic waves comprising an elastic substrate layer and at least one conductive layer laminated on top of it. The elastic substrate layer has a pattern of a plurality of perforated regions, and the conductive layer has conductive protuberances formed by incisions into the conductive layer and being coaxial with the perforated regions of the elastic substrate layer. The conductive protuberances are folded back onto the back side of the elastic substrate material so that they pass through the perforated regions of the substrate layer and protrude from the back side of the elastic substrate layer so that they come into contact with the back side of the elastic substrate layer. This is to achieve thermal conductivity in the z-axis direction. Again, this document does not teach to provide a laminate with incisions to improve its flexibility, wherein no material is removed from the laminate, and that the geometry of these incisions has an influence on the mechanical properties.

In summary, the laminates described by the state of the art have at least one of the following drawbacks:

Simple laminates of at least one substrate layer, e. g. a polymer film or a fiber-containing layer, and at least one metal layer are suitable for the sheathing of three-dimensional objects for shielding against electromagnetic waves in a very limited manner, in particular of objects having a complex structure. These laminates lack high stretchability under the application of even small forces.

Even the well-known perforated or punched laminates often do not have good stretchability in more than one spatial direction. At the application of excessive force when sheathing three-dimensional objects, the laminates are prone to uncontrollable tearing. In the region of such tears, the electromagnetic shielding can be substantially affected. The creation of perforations or punchings which do not allow the laminate to be stretched with small applied forces can lead to undesirable tear propagation during tensile stressing.

There is therefore a need for laminates which mitigate or avoid the above-mentioned drawbacks. In particular, they are to combine good electromagnetic shielding with good drapability. They are also to be suitable for the manufacture of shielded components without the need to be pre-formed. Preferably, it should be possible to shape the components to be shielded in one process step and to bond it to the laminate for shielding against electromagnetic radiation. Examples of this are special injection molding processes, such as back injection and multi-component injection molding, or forming methods, such as thermoforming. In particular, the laminates of the present invention are to be suitable for use in a method of producing fiber-reinforced composites, especially in an SMC method (extrusion of Sheet Molding Compounds).

The present invention has the object of providing laminates for shielding against electromagnetic radiation and a method of producing components shielded against electromagnetic radiation which overcome the above-described drawbacks.

In the field of layered laminates on the basis of metal foils for shielding against electromagnetic waves, it has hitherto not been known that a material can be provided with incisions of predetermined geometry to improve the application-specific properties. WO 2016/169948 A1 describes in the field of wound dressings the use of a self-adhesive wound dressing of a fiber material, which has two groups of incisions of a predetermined geometry. This wound dressing has improved flexibility, especially also in the wet state, as well as improved liquid drain.

Surprisingly, it has been found that the above object is achieved by a laminate for shielding against electromagnetic radiation, comprising a) at least one metal foil, and b) a sheet-like substrate as a carrier material, wherein the laminate includes a plurality of incisions into the base area, which have a predetermined spatial arrangement.

SUMMARY OF THE INVENTION

In an embodiment, the present invention provides a flexible laminate for shielding against electromagnetic radiation, comprising: a) at least one metal foil; and b) a sheet-like substrate comprising a fiber material, film material, or foam material, wherein the laminate comprises a plurality of objects formed by incisions into a base area of the laminate, wherein each object of the plurality of objects comprises two or more incisions having a common initial point, and wherein the two or more incisions, or each of two adjacent incisions of the two or more decisions, define an angle of 45° to 160°.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

In an embodiment, the present invention provides a flexible laminate for shielding against electromagnetic radiation, comprising a) at least one metal foil, and b) a sheet-like substrate, comprising or consisting of a fiber material, film material or foam material, wherein the laminate has a plurality of objects formed by incisions into the base area of the laminate, wherein each object consists of two or more incisions having a common initial point, and wherein the two incisions, or each of two adjacent incisions, define an angle of 45 to 160°.

In an embodiment, each object comprises two or more straight incisions. In particular, each object consists of two or more straight incisions.

Each of the incisions can completely or partially perforate the laminate. This means that only at least the metal foil a)

is partially or completely perforated, or that only the sheet-like substrate b) is partially or completely perforated, or that the at least one metal foil a) and the sheet-like substrate b) are both partially or completely perforated. Especially, each of the incisions completely perforates the metal foil a). If the laminate according to the invention has more than one, for example 2, 3, 4, 5, or more than 5 metal foils a), each of the incisions preferably completely perforates all of the metal foils. The sheet-like substrate b) is not perforated or only partially perforated or completely perforated by each of the incisions.

A further subject matter of the invention is a method for producing a component shielded against electromagnetic radiation, comprising:

i.1) providing a laminate as described herein, and at least one polymer material (c) or a precursor thereof, ii. 1) subjecting the laminate and the polymer material (c) or the precursor thereof to forming while bonding the materials, and therein, if present, bringing the precursor to polymerization, or i.2) providing a laminate as defined before and in the following, and at least one component, ii.2) partially or completely coating or sheathing the component with the laminate.

Especially, the component shielded against electromagnetic radiation is produced by a method in accordance with variant 1, wherein the bond between the laminate and the polymeric material (c) is produced by an SMC method or a back-injection method or a thermoforming method.

A further subject matter of the invention is an electromagnetically shielded component comprising a laminate according to the invention as defined before and in the following, or obtainable by a method as defined before and in the following.

A further subject matter of the invention is the use of the laminate as defined before and in the following, for shielding against electromagnetic radiation, preferably of power-conducting systems and power stores, particularly preferably in electronics housings. Preferred fields of use are in electric vehicles, aircraft, spacecraft, preferably in electric vehicles and drones.

The laminates of the present invention are sheet-like objects having an essentially two-dimensional, planar extension and having a by contrast smaller thickness. To describe them, a cartesian coordinate system may be employed, wherein the base area of the laminate is in the plane defined by the x axis and the y axis (also referred to as the xy plane). The z axis which is orthogonal thereto can serve to describe the material thickness.

The laminates according to the invention are flexible, i. e., in relation to the base area of the laminate (in the xy plane), they have good stretchability in more than one spatial direction. This flexibility is achieved by incisions in the base area of the laminate. The incisions are preferably created essentially in the direction of the z axis orthogonal to the base area. Preferably, the incision angle in relation to the base area of the laminate (i. e. in the xy plane) is 10° to 90°, particularly preferably 30 to 90°, in particular 60 to 90°, especially 80 to 90°. In a preferred embodiment, the flexible laminate of the present invention is a fiber-reinforced composite material. In accordance with the description common for fiber-reinforced composite materials, the laminates of the present invention have good flexibility (stretchability) not only in the direction of the x axis, that is the roll direction (machine direction, MD), but also in the direction of the y axis, i. e. orthogonal to the roll direction (cross machine direction, CMD). In the stress-strain diagram it can be seen that the laminates according to the present invention have good stretchability both in the machine direction and orthogonal to the machine direction already at low tensile stresses. This is an advantage over the laminates known from the state of the art for shielding against electromagnetic radiation.

An adhesive/welding connection is created by atomic forces or molecular forces between the bonding partners. The adhesive/welding connections of plastic materials are adhesive connections and welding connections; injection molding processes also result in adhesive/welding connections. An adhesive/welding connection is a generally non-releasable connection. Adhesive/welding connections are created by the interlocking engagement of at least two connection partners. This is why the connection partners are unable to be released even without the transmission of force or when the force transmission is interrupted. Frictional engagements require a normal force acting on the surfaces to be connected. Their mutual displacement is prevented as long as the counter force caused by static friction is not exceeded.

In the context of the present invention, an incision is the partial or complete perforation of the metal foil and, as the case may be, of the sheet-like substrate without intentionally removing material from the metal foil or the substrate. Common cutting methods, such as knife or laser cutting methods may be used.

According to the invention, the laminate has a plurality of objects formed by incisions in the base area of the laminate, wherein each object consists of two or more straight incisions having a common initial point. In principle, it is possible for the incisions forming an object not to meet (or, with at least three incisions, not to all meet) at a common initial point. The common initial point would then be an imaginary point at which all the lines meet, which results when the incisions are extrapolated beyond their real end points. The distance of the end points of the incisions, which are each closest to the initial point, will be at most 2 mm to the initial point, preferably at most 1 mm, in particular at most 0.5 mm. Preferably, all incisions forming an object meet at the common initial point.

The incisions can be created by the usual methods, e. g. by means of cutting tools (punching knives) or by lasers. The laminate is partially or completely perforated by the straight incisions without any material being removed from the laminate. Preferably, the incisions are created by means of punching tools.

The laminates of the present invention can have incisions over the entire area of their base area or at least in a partial area thereof. The regions of the laminate having incisions have high stretch values at low force applications in more than one spatial direction. The incisions are made in such a way that drapable products are created which optimally conform to the shape of the components to be electrically shielded. If the geometry of the components allows that only certain regions of the laminate have to be deformed, it is sufficient to apply the incisions in those regions. It is thus ensured that the components equipped with the laminates according to the invention have good electromagnetic shielding in all required regions. Advantageously, the laminates do not have to be pre-formed and are suitable for both the sheathing of components without requiring an adhesive connection, and for their use in a molding method in which the component is molded and at the same time is bonded to the laminate (usually in an adhesive/welding manner).

The incisions can be straight or curved, e. g. circular or non-circular. Preferably each object consists of two or more straight incisions.

According to the invention, the two incisions of each object, or two adjacent incisions of each object, define an angle of 45 to 160°. Preferably, the two incisions or adjacent incisions each define an angle of 55 to 140°. With curved incisions, the angle refers to the tangent to the incisions at the common initial point of the incisions.

Preferably, each object is formed of 2, 3, 4, 5, or 6 incisions, particularly preferably 2, 3, or 4 incisions.

Preferably, an object is formed of x incisions, wherein x is 3, 4, 5, or 6, and each two adjacent incisions define an angle of about (360/x°). The angle values can be both exactly equal and can have a deviation from equipartition of about +/−20°, preferably of about +/−10°, especially of +/−5°. A precise equipartition of the angle values is preferred.

In a first embodiment, an object is formed by three incisions. Preferably, two adjacent incisions of each object will have an angle of 110 to 130°. Especially, all three angles, which the incisions define together, are 120°.

In a second embodiment, an object is formed by four incisions. Preferably, two adjacent incisions of each object will have an angle of 80 to 100°. Especially, all four angles, which the incisions define together, are 90°.

Preferably, the objects formed by the incisions, have a type of symmetry selected from:
  at least three-fold rotational symmetry,
  axis symmetry having at least two reflection symmetry axes,
  an inversion center,
  at least three-fold rotational symmetry axis.

Preferably, all objects have a type of symmetry selected from the above-mentioned. In an embodiment, all objects have the same type of symmetry.

Preferably, the objects formed by incisions into the base area of the laminate are arranged in groups, wherein one group of objects is characterized in that all common initial points of the objects lie in one straight line. Preferably, all objects of a group have identical shape and size. Especially, all objects of a group have identical shape, size and spatial arrangement (orientation). Identical orientation means that all objects of a group are aligned in an identical fashion.

An embodiment is a laminate, wherein the objects form groups, wherein
  all objects of a group have identical shape, size and spatial arrangement, and
  the common initial points of all objects of one group are on a straight line.

Preferably, the objects arranged by their initial points along a straight line have a pattern as a guiding structural principle. Especially, the groups form a pattern, wherein
  a pattern comprises 1, 2, 3, 4, or more than 4 groups of objects,
  all straight lines on which the objects lie are arranged in parallel,
  the groups have a regular sequence in the direction orthogonal to the straight line.

In an embodiment, all objects have identical shape and size.

Preferably, the length of the incisions is in a range from 1 to 40 mm, particularly preferably 1.5 to 20 mm, in particular 2 to 15 mm, especially 2 to 10 mm.

Preferably, the minimum distance between two objects is in a range from 0.1 to 15 mm, particularly preferably 0.3 to 12 mm, in particular 0.5 to 5 mm.

The flexible laminate of the invention for shielding against electromagnetic radiation comprises at least one metal foil as component a).

Component a) can comprise or can consist of one or more, e. g. 2, 3, 4, 5, or more than 5 metal foils. In a preferred embodiment, component a) comprises 1, 2, or 3 metal foils. When component a) comprises more than one metal foil, an adhesion promoting layer may be present between each of two metal foils. Preferably, the adhesion promoting layer comprises at least one polymer, preferably selected from thermoplastic materials or curable polymer compositions. Suitable curable polymer systems can be based on well-known polyesters, polyurethanes, epoxy resins and silicones. Preferable thermoplastic materials are polyester, polyamides, polyolefins, and mixtures thereof. Preferred polyesters are polyethylene terephthalate and polybutylene terephthalate. Preferred polyolefins are polyethylene or polypropylene.

The metal of the metal foil is preferably selected from aluminum, titanium, magnesium, tin, nickel, copper, silver, gold etc. Metal alloys are also suitable, preferably µ-metal (permalloy). Particularly preferably, the metal foil comprises aluminum or is made of aluminum.

Preferably, the metal foil has a thickness of 3 to 250 µm, particularly preferably 5 to 225 µm, in particular from 7 to 200 µm.

The flexible laminate according to the invention for shielding against electromagnetic radiation comprises, as component b), a sheet-like substrate comprising or consisting of a fiber, film or foam material.

Substrate b) can have a one- or more-layer structure. An embodiment is a substrate b) having a multi-layer structure.

In a preferred embodiment, component b) comprises at least one fiber material. Preferably the fiber material is present as a one- or more-layer sheet material. This sheet-like material has preferably at least one layer selected from non-woven fabrics, layerings, woven fabrics, knitted fabrics, papers and combinations thereof. Preferably, substrate b) comprises a one- or more-layer fiber material, preferably selected from non-woven fabrics, papers, woven fabrics and combinations thereof. Particularly preferably, component b) comprises at least one layer, which is a non-woven fabric.

For the purposes of the present invention, a "non-woven fabric" is a material of fibers of limited length, endless fibers (filaments) or cut yarns of any type and any origin, which are combined in any way to form a fiber layer or a fiber web, and are connected to each other in any way; excluded therefrom are the crossing or looping of yarns as it occurs during weaving, knitting, point production, braiding and the production of tufted products. Films and papers are not among non-woven fabrics.

The fibers used for the production of the sheet material can be filaments, stacked and/or short-cut fibers. According to the invention, the fibers are stacked fibers and/or short-cut fibers. Stacked fibers or short-cut fibers can be produced and laid by various well-known production methods, such as carding methods, airlaid and wetlaid methods.

In a first suitable embodiment, substrate b) comprises at least one mechanically bound non-woven fabric. In mechanically bound non-woven fabrics, a fiber web is consolidated, e. g. by means of a needling process or by means of water or steam jets.

In a further suitable embodiment, substrate b) comprises at least one thermally bound non-woven fabric. Thermally bound non-woven fabrics can be consolidated, e. g. by means of pressing under high temperature, for example by means of a calender or hot air. The fiber web of thermally bound non-woven fabrics usually comprises fibers of polyester or polyamide.

In a further suitable embodiment, substrate b) comprises at least one chemically bound non-woven fabric. In chemically bound non-woven fabrics, the fiber web is provided with a binder (e. g. acrylate binder) by means of impregnating, spraying or by means of other common application methods, and subsequently cured. The binder binds the fibers to each other to form a non-woven fabric.

In a preferred embodiment, substrate b) comprises at least one spunbond. To produce the spunbond, endless fibers (filaments) are laid and can then be consolidated, e. g. by treatment with heated rollers and by means of steam stream/hot air. When consolidation is carried out by rollers, one of the two rollers is usually provided with an engraving, e. g. consisting of circular, rectangular or diamond-shaped points. The fibers weld together at the contact points and thus form a non-woven fabric. A version is a thermally consolidated spunbond.

When the substrate b) includes at least one non-woven fabric, the weight per unit area can vary widely. A weight per unit area in accordance with DIN EN 29073-1:1992-08 of 10 to 400 g/m$^2$, preferably from 15 to 300 g/m$^2$, in particular from 20 to 250 g/m$^2$ is preferred.

As a further embodiment, component b) can comprise a film material. Suitable film materials are thermoplastic materials, such as polyolefins, e. g. polyethylene or polypropylene, polyester, e. g. polyethylene terephthalate, polybutylene terephthalate or polyethylene naphthalate, polyamide, polyacrylate etc. In an embodiment, substrate b) comprises at least one polymer film in combination with at least one fiber material. Component b) can then include the film material as a reinforcing inlay for the fiber materials. Substrates b) having high mechanical strength and low weight are thus obtained. It is also possible for the film material and the fiber material to be connected in an adhesive/welding manner by laminating under heat and/or pressure. This can be done independently from or preferably together with the production of the laminate of the metal foil(s) a) and the sheet-like substrate b). To do this, fiber materials, especially non-woven fabric and foil are connected in such a manner that 2-, 3-, or more-layer laminates are obtained, e. g. having a non-woven-fabric/foil or non-woven-fabric/foil/non-woven-fabric structure. To produce laminates, at least one fiber web layer can be brought into connection with at least one polymer layer, and the combination can then be pressed under heating. Herein, the polymers are preferably melted to such a point that they at least partially fill the pores and spaces between the fibers.

As a further embodiment, component b) can comprise a foam. A foam for the purposes of the invention is a porous, at least partially open-pore structure with communicating cells. E. g., polyurethane foams are suitable. Polyurethane foams can be fabricated in the well-known fashion from polyisocyanates, polyoles and, as the case may be, at least one more comonomer. E. g., polyester polyurethanes and polyether polyurethanes are suitable.

Substrate b) can additionally include at least one additive. Suitable additives are, on the one hand, fillers and reinforcing materials. These are particle fillers, fiber materials and any transition forms. Particle fillers can have a wide range of particle sizes ranging from dust-like to coarse-grain particles. Fillers can be organic or inorganic filler and reinforcement materials. For example, inorganic fillers, such as carbon fibers, kaolin, chalk, wollastonite, talcum, calcium carbonate, silicates, titanium dioxide, zinc oxide, glass particles, e. g. glass spheres, nanoscale layered silicates, nanoscale aluminum oxide ($Al_2O_3$), nanoscale titanium dioxide ($TiO_2$), layered silicates and nanoscale silicon dioxide ($SiO_2$). The fillers can also be surface-treated. Suitable layered silicates are kaolines, serpentines, talcum, mica, vermiculites, illites, smectites, montmorillonite, hectorite, double hydroxides and mixtures thereof. The layered silicates can be surface-treated or untreated. Furthermore, one or more fiber materials can be used. These are preferably selected from well-known inorganic reinforcing fibers, such as boron fibers, glass fibers, silicic acid fibers, ceramic fibers and basalt fibers; organic reinforcing fibers, such as aramid fibers, polyester fibers, nylon fibers and polyethylene fibers and natural fibers, such as wood fibers, flax fibers, hemp fibers and sisal fibers.

Suitable additives are furthermore selected from antioxidants, heat stabilizers, flame protection agents, light protection agents (UV stabilizers, UV absorbers or UV blockers), catalysts for the cross-linking reaction, thickeners, thixotrope agents, surfactants, viscosity modifiers, lubricants, colorants, nucleation promoters, antistatica, mold release agents, antifoaming agents, bactericides etc.

Substrate b) can include at least one binder. Binders serve to improve, for example, adhesion for fiber materials, especially non-woven fabrics. Furthermore, they serve to improve adhesion between various layers of the substrate b), e. g. between two non-woven layers. Furthermore, binders serve to improve adhesion for fillers and reinforcing materials and further additives used in component b). Suitable binders comprise at least one polymer material, preferably selected from polyvinyl alcohol, polyacrylates, polyurethanes, styrene-butadiene rubber, nitrile-butadiene rubber, polyester resins, epoxy resins and polyurethane resins.

In a preferred embodiment, substrate b) comprises at least two layers, wherein one of the layers is formed as a reinforcing inlay (scrim). The use of reinforcing inlays can increase, for example, the adhesion between the two adjacent layers. Suitable materials for the reinforcing inlay are the ones mentioned before as fiber materials. Especially, a polyester is used. Generally suitable as a reinforcing inlay are the sheet materials described therefor of fibers having yarns crossing in two directions. These usually have a substantially lower weight per unit area than the above-described non-woven fabrics. The weight per unit area of the reinforcing inlay is preferably in a range from 1 to 100 g/m$^2$, preferably from 1 to 50 g/m$^2$, in particular from 2 to 25 g/m$^2$.

Preferably, the substrate b) has a thickness from 50 to 1500 μm, particularly preferably from 100 to 1000 μm, particularly preferably from 150 to 800 μm.

In a specific embodiment, for the production of substrate b), a non-woven fabric material is used, preferably a spunbond, in particular a polyester spunbond, and bonded in a laminating process with at least one polymer material as a binder to a multi-layer composite material. This type of production is carried out in accordance with common methods known to the person skilled in the art, e. g. thermobonding or extrusion. In thermobonding, an embossing roller is used to plastify the polymer material and/or the non-woven fabric in a point-wise fashion by applying high temperature and pressure thus causing the two material sheets to bond. Extrusion is preferred. For example, for the production of a non-woven-fabric/foil substrate, having a non-woven-fabric/foil/non-woven-fabric structure, two non-woven fabric sheets can be bound together by a binder. To do this, the plastified binder can be extruded onto one of the material sheets and subsequently combined with a further non-woven fabric sheet, which is followed by pressing and cooling. It is also possible to form a press nip between two material sheets into which the binder is extruded, pressed together with the material sheets and cooled. In accordance with this method, multi-layered substrates b) can be produced by repeating the extrusion and curing steps, wherein the layer sequence of the non-woven fabric layers and polymer layers may vary. If a plurality of non-woven-fabric layers and/or a plurality of binder layers are provided, they can have the same composition or different compositions, e. g. in view of the type of binder, the type of fiber material, the material amount etc. By controlling the extrusion conditions, e. g. the amount of binder applied, the type of binder, the temperature, the sheet speed and the line pressure, the material properties can be influenced. It can be controlled, for example, how long the binder is liquid between the material sheets, i. e., how well it can bond to the two material sheets. This also enables, e. g., the adhesion strength between the material sheets or the intrusion depth into the material sheets to be controlled. The number of sheets to be laminated is not limited. It is only necessary to provide the required heating of the sheets, e. g. by means of a heating cylinder. In principle, it also possible not only to laminate non-woven fabrics with films, but each conceivable combination (e. g. non-woven fabric with non-woven fabric; non-woven fabric with film; non-woven fabric with film with non-woven fabric; film/film (foil); etc.).

The production of the flexible laminate of the invention for shielding against electromagnetic radiation is carried out by bonding together at least one metal foil a) and at least one sheet-like substrate b) or their precursors in a laminating process. This bond is usually an adhesive/welding bond. Alternatively or additionally, an interlocking and/or frictional bond can be created. In the method, individual components, e. g. a plurality of metal foils bound by a binder, a plurality of fiber materials provided with a binder, can be produced as precursors (intermediate products) and subsequently bonded together to form the final laminate. Non-curable or curable polymer systems in the form of one- or more-component systems can be used as binders.

Lamination, whether in a plurality of individual steps or in a single step, is usually carried out at elevated temperature and/or under elevated pressure. The already described methods are suitable therefor. For example, the components to be laminated can be passed in layers as a sheet material through one or more roll gaps. Furthermore, the components to be laminated can be pressed in the form of a stack at high temperature and high pressure for a predetermined period of time, which is sufficient to plastify the binder and, as the case may be, to cure it and to form a laminate.

The laminates of the invention have high resistance against tear propagation, in the case of both the incisions present in the laminate as well as when undesirable damage occurs during sheathing or connecting with at least one component. In tear propagation tests, the resistance of an incision against tear propagation is determined under a tensile stress. The trapezoid tear propagation test in accordance with DIN EN ISO 9073-4:1997-04 is used to determine the tear propagation strength of incisions in coated fabrics and non-woven fabrics. The trapezoid tear propagation force is the highest tensile force which occurs at the tensile stress of the measuring specimen to further tear the incision.

Preferably, the laminates of the invention have a tear propagation strength, determined in accordance with DIN EN ISO 9073-4:1997-07, in the range of 1 to 100 N, preferably 2 to 80 N, in particular 3 to 40 N.

A further subject matter of the invention is a method of producing a component shielded against electromagnetic radiation, comprising:
i.1) providing a laminate as defined before, and at least one polymer material (c) or a precursor thereof,
ii. 1) subjecting the laminate and the polymer material (c) or the precursor thereof to forming while bonding the materials, and therein, if present, bringing the precursor to polymerization,
or
i.2) providing a laminate as defined before, and at least one component,
ii.2) partially or completely coating or sheathing the component with the laminate.

Variant 1:

In accordance with the first variant of the method, a component is produced from at least one polymer material (c) or its precursor, which requires shielding against electromagnetic radiation, and bonded to a laminate according to the invention. This bond is usually an adhesive/welding connection. The production of the laminate and the component can occur in separate steps. Alternatively, the components forming the laminate and the components forming the component to be shielded can be bonded together in a single step.

Polymer materials (c) for the purposes of the present invention are materials containing at least one polymer or consisting of at least one polymer. In addition to the at least one polymer, the polymer materials (c) can include at least one further component, e. g., fillers, reinforcing materials or additives different therefrom. In an embodiment, the polymer materials (c) are present in the form of a composite.

Preferably, the polymer component of the polymer material (c) is selected from polyurethanes, silicones, fluorosilicones, polycarbonates, ethylene-vinyl acetates, acrylonitrile butadiene acrylates, acrylonitrile butadiene rubbers, acrylonitrile butadiene styrenes, acrylonitrile methyl methacrylates, acrylonitrile styrene acrylates, cellulose acetates, cellulose acetate butyrates, polysulfones, poly(meth)acrylates, polyvinylchlorides, polyphenylene ethers, polystyrenes, polyamides, polyolefins, polyketones, polyetherketones, polyimides, polyetherimides, polyethylene terephthalates, polybutylene terephthalates, fluoropolymers, polyesters, polyacetals, liquid crystal polymers, polyethersulfones, epoxy resins, phenole resins, chlorosulfonates, polybutadienes, polybutyls, polyneoprenes, polynitriles, polyisoprenes, natural rubbers, styrene isoprene styrenes, styrene butadiene styrenes, ethylene propylenes, ethylene propylene diene rubbers, styrene butadiene rubbers and their copolymers and mixtures thereof.

In a preferred embodiment, in step i.1), the polymer material (c) is provided in the form of a composite material comprising the polymer component of the polymer material (c) and at least one further component (K) preferably selected from polymers, polymer materials, textile materials, ceramic materials, mineral materials and combinations thereof, particularly preferably selected from reinforced and/or filled plastic materials, polymer films, molded polymer articles and combinations thereof.

In an embodiment, in step i.1), the polymer material (c) is provided in the form of a composite material comprising at least one fibrous reinforcing material, wherein the fibers are preferably selected from glass fibers, carbon fibers, aramid fibers, polyester fibers and combinations thereof.

In a further embodiment, in step i.1), the polymer material (c) is provided in the form of a composite material comprising a fibrous reinforcing material embedded in a thermoplastic material matrix (organic sheet).

In step ii.1), the laminate and the polymer material (c) or its precursor are subjected to forming while bonding together the laminate and the polymer material.

In a first preferred embodiment, an SMC method (extrusion method, SMC=Sheet Molding Compound) is used for the production of a component shielded against electromagnetic radiation. In SMC processing, it is possible to position a laminate of the invention in the cavity of a mold and to subject it to a pressing process together with a polymer material. This also uses the polymer material in the form of a sheet-like substrate obtained by mixing and formulating at least one polymeric binder, at least one fiber material and, as the case may be, at least one additive. An SMC semi-finished product is thus produced which, together with the laminate according to the invention, can be further processed by means of extrusion to a component shielded against electromagnetic radiation.

In a further embodiment, a back-injection method is used to produce a component shielded against electromagnetic radiation. In back injection, components are produced consisting of a polymeric substrate and a further plastifiable polymer material. As the polymeric substrate, a laminate of the present invention can be used. Back injection can be carried out by means of various methods, such as inmold decoration (IMD), film insert molding (FIM), inmold labelling (IML), inmold coating (IMC) or inmold painting (IMP). They all have in common that the laminate is placed in an injection mold and back injected by a further plastic material and molded so that a component shielded against electromagnetic radiation is created.

In a further embodiment, a forming method, especially a thermoforming method is used for the production of a component shielded against electromagnetic radiation.

Variant 2:

In accordance with a second variant of the method of producing a component shielded against electromagnetic radiation, in step i.2), a laminate as defined above and at least one component are provided and subsequently, in step ii.2), the component is partially or completely coated or sheathed with the laminate.

To drape the component with the laminate, the laminate can be first adapted to the geometry of the component to be shielded against electromagnetic radiation. Thus, the laminate can be brought into the desired shape by cutting and/or punching. All conceivable contours are possible. It is also possible to apply folds, e. g., to create a housing in which the component can be placed.

A further subject matter of the invention is a component shielded against electromagnetic radiation comprising a laminate as defined before and in the following, or obtainable by a method as defined before and in the following.

A further subject matter of the invention is the use of the laminates according to the invention as defined before, for shielding against electromagnetic radiation, preferably of power-conducting systems and power storage, particularly preferably in electronics housings.

The laminates of the invention, and produced in accordance with the method of the invention, and components shielded against electromagnetic radiation made therefrom are advantageously suitable for their use in electric vehicles, aircraft and spacecraft. A preferred field of application is the use of the laminates of the invention, and produced in accordance with the method of the invention, in electric vehicles and drones. An electric vehicle is generally a means of transport that is at least temporarily or partially driven with electric energy. The energy can be generated in the vehicle itself, stored in batteries or temporarily or permanently introduced from the outside (e. g. by means of power rails, overhead wires, induction etc.), wherein combinations of different types of energy supply are possible. Battery-driven vehicles are internationally also referred to as Battery Electric Vehicle (BEV). Examples of electric vehicles are road vehicles, rail vehicles, watercraft or aircraft, such as electric cars, electric motor scooters, electric motorbikes, electric tricycles, battery and trolley buses, electric trucks, electric trains (railways and tramways), electric bicycles and electric scooters. Electric vehicles in the meaning of the invention are also hybrid electric vehicles (HEV) and fuel cell vehicles (Fuel Cell (Electric) Vehicle, FC(E)V). In fuel cell vehicles, electric energy is generated from hydrogen or methanol by means of a fuel cell and is directly converted to motion by the electric drive or temporarily stored in a battery.

In electric mobility, four core areas are distinguished, in which the shielding of electromagnetic radiation is of critical importance: the power electronics, the battery, the electric motor and the navigation and communication equipment. The laminates of the invention are suitable in an advantageous manner for the production of electronics housings for electric-mobility vehicles in these four areas.

Modern electric vehicles are based on brushless electric motors, such as induction machines or permanently excited synchronous machines (brushless DC machine). The commutation of the supply voltage in the phases of the motor and thus the generation of the rotating field necessary for operation, is performed in an electronic manner by so-called inverters. During braking, the electric motor functions as a generator and provides an alternating voltage which is rectified by the inverter and can be fed to the traction battery (recuperative braking). Both the fuel cells and the batteries in electric vehicles supply higher voltages than the 12 V direct current or 24 V direct current hitherto common in the automotive industry. For many components of the onboard electronics, a low-voltage onboard network is still necessary. For this purpose, DC/DC converters are used which convert the high voltage of the battery to a corresponding lower voltage and feed loads such as the air conditioning, power steering, lighting, etc. A further important power-electronics component in the electric car is the onboard charging unit. Charging stations for supplying electric cars provide either one-phase or three-phase alternating current or direct current. To charge traction batteries, direct current is of the essence, which is generated with the aid of an onboard charging unit by rectifying and converting the alternating current. The substrates of the invention are especially suitable for shielding against electromagnetic radiation from inverters, DC/DC converters and onboard charging units. The laminates of the invention are particularly suitable for the shielding of navigation and communication equipment, such as especially GPS systems, against electromagnetic radiation.

The invention will now be described in more detail with reference to the following, non-limiting examples.

EXAMPLES

Examples 1 to 3

For the production of laminates of the present invention, a thermally consolidated polyester spunbond on the basis of PET having a weight per unit area according to Table 1 and an aluminum foil having a thickness according to Table 1 were used. In example 1, the substrate additionally includes a net-like polyester reinforcing inlay (scrim) on the basis of PET having a weight per unit area of 5 g/m².

For the production of laminates of the present invention a three-layer polymer coating consisting of a layer of an adhesion promoting polymer, followed by a polyamide layer (PA 6) and a second layer of an adhesion promoting polymer was applied on the aluminum foil by means of triple extrusion with a wide-gap die. The temperature at the exit of the extruder was 295° C. The fiber material was fed to the hot polymer layer and subsequently pressed in a calender consisting of two rollers at elevated temperature and a line pressure of about 30 N/mm.

Figure 1A:
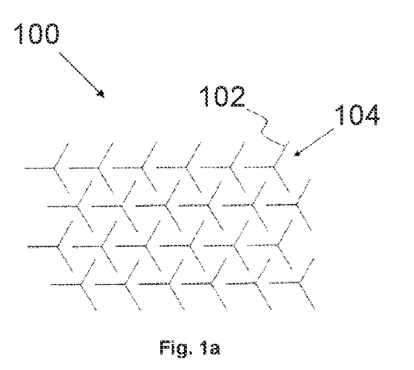
FIGS. 1a-e show examples of patterns such as they are present as incisions on the laminates of the present invention.
Figure 1B:
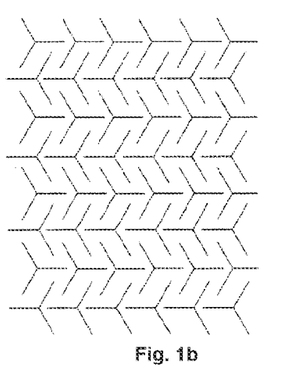
Figure 1C:
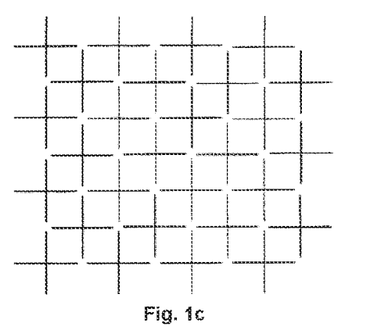
Figure 1D:
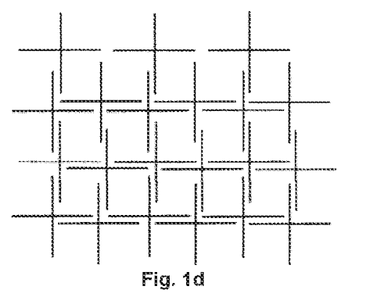
Figure 1E:
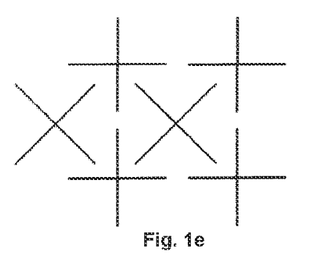

The laminates were provided with a pattern 100 of incisions 102 by a punching tool, as shown in FIG. 1a). All objects 104 consist of three incisions 102, wherein two adjacent incisions 102 define an angle of 120° in each case. The incision length is 5 mm. All objects 104 have the same orientation, and the distance of the middle points of two adjacent objects 104 is 7.5 mm.

TABLE 1

| Example No. | Thickness of aluminum foil | Substrate |
| --- | --- | --- |
| 1 | 7 μm | PES spunbond 50 g/m² PES scrim 5 g/m² |
| 2 | 50 μm | PES spunbond 85 g/m² (LDFDH 51085_69, Fa. Freudenberg) |
| 3 | 100 μm | PES spunbond 85 g/m² |

Figure 2:
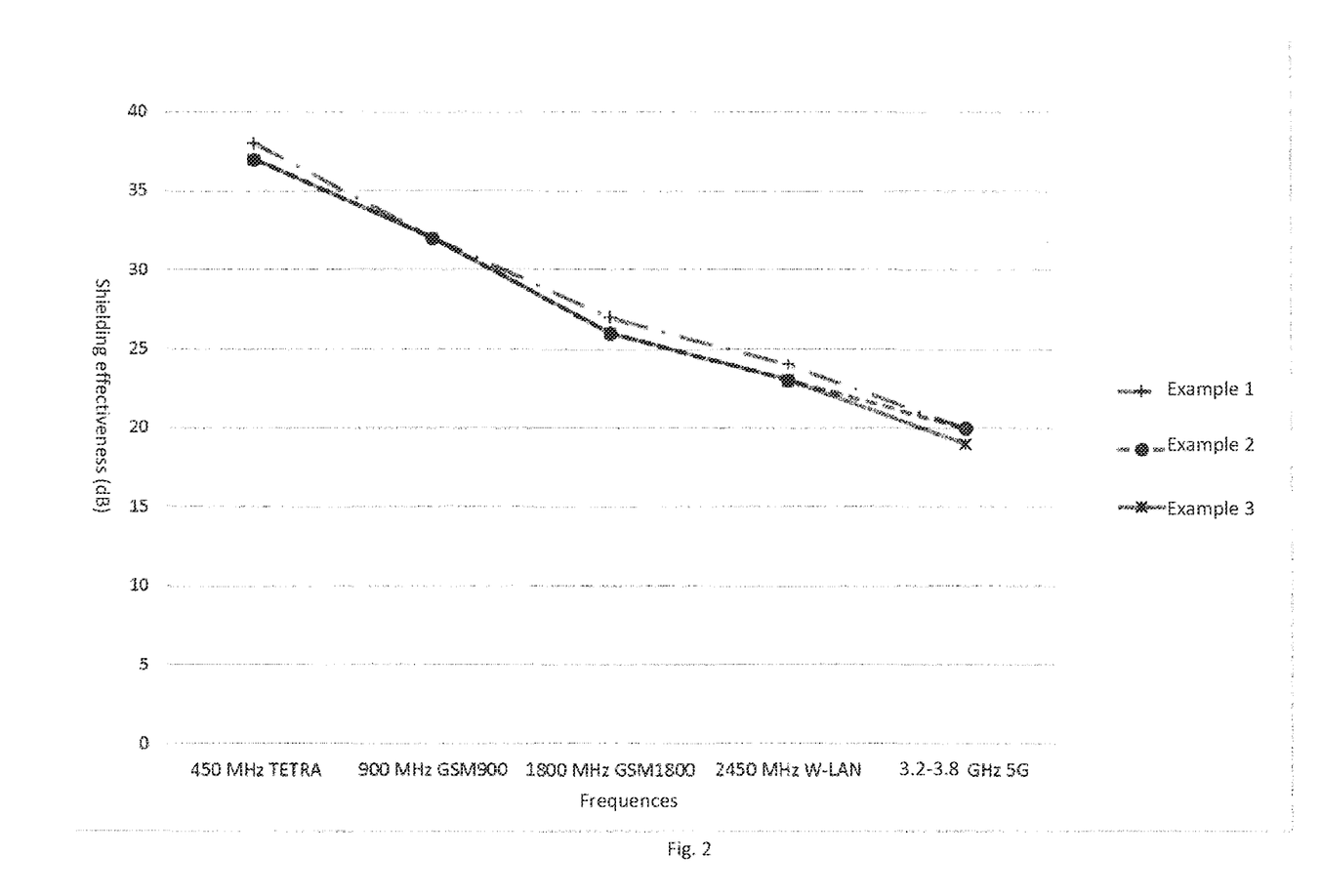
FIG. 2 shows the shielding effectiveness in accordance with ASTM D 4935-2010 in [dB] for the laminates of examples 1 to 3 according to the invention.

The shielding effectiveness values in accordance with ASTM D-4935-2010 were determined on the laminates of examples 1 to 3. As can be derived from FIG. 2, despite the incisions, all laminates had good shielding effectiveness.

Examples 4 to 7, Comparative Examples CE 1 to 4

For the production of laminates A) and B) according to the present invention, a thermally consolidated polyester spunbond on the basis of PET (LDFDH 30010-49, Fa. Freudenberg) was used, a three-layer polymer coating was applied by means of extrusion as described with reference to examples 1 to 3, and an aluminum foil and the substrate were welded together in a point-wise fashion by means of an embossing roller.

TABLE 2

| Laminate | Thickness of aluminum foil | Substrate |
| --- | --- | --- |
| A | 50 μm | spunbond 100 g/m² PA 6 40 g/m² |
| B | 50 μm | spunbond 100 g/m² PA 6 40 g/m² |

Laminates A) and B) were provided with a pattern of incisions as defined in examples 1 to 3 and shown in FIG. 1a) by means of laser cutting with an UV laser. The comparative material was laminates A) and B) without incisions.

Figure 3:
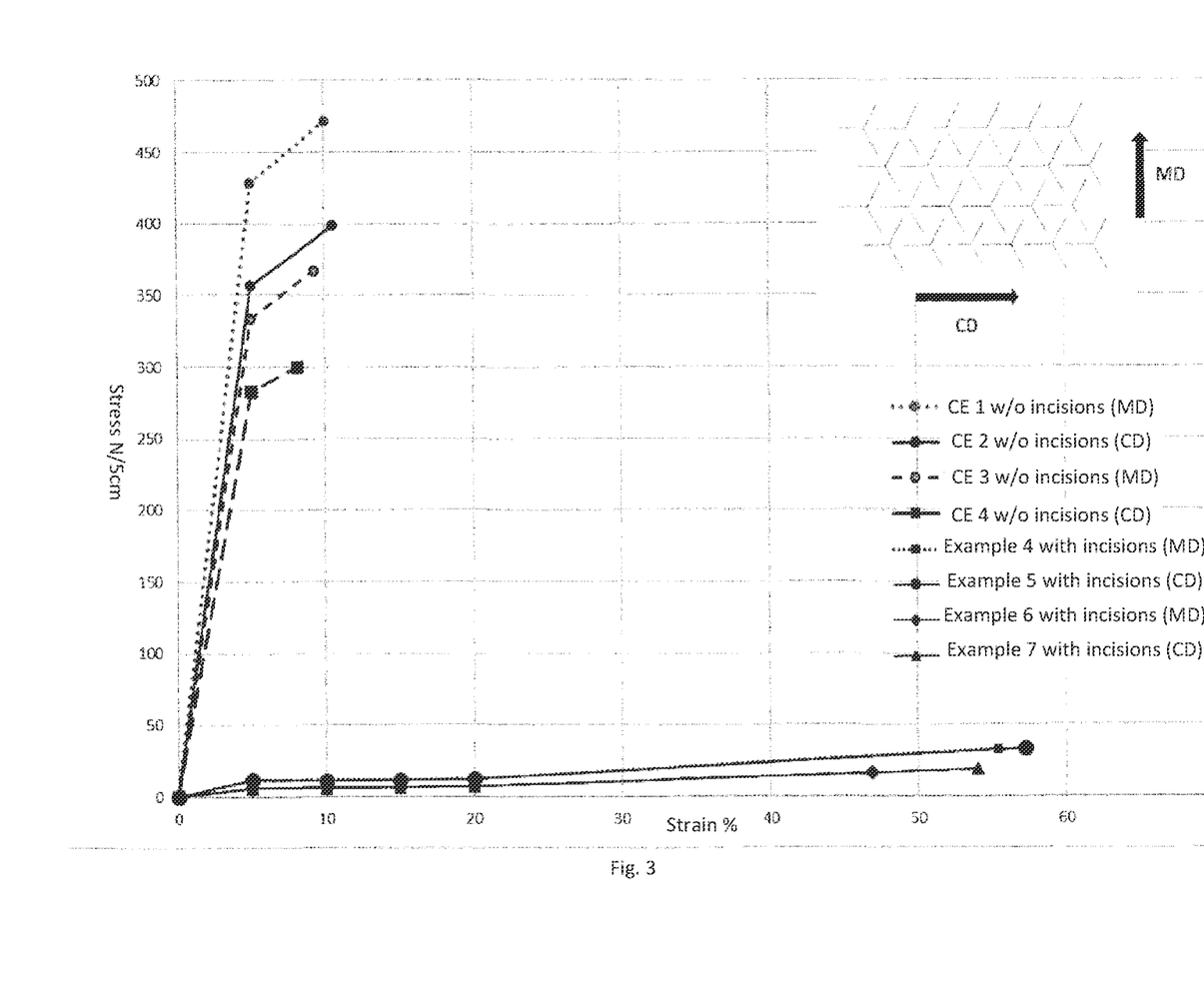
FIG. 3 shows the measuring values of the stress-strain behavior in accordance with DIN ISO 9073-3:1989-07 on laminates of the present invention with incisions and comparative laminates without incisions, each in the machine direction (MD) and in the cross-machine direction (CD).

From the laminates of the invention and the comparative laminates, test specimens were punched and the maximum tensile force (MTF) and maximum tensile strain in accordance with DIN ISO 9073-3 were determined. In each case, the stress-strain behavior was measured in the machine direction (MD) and in the cross-machine direction (CD). The results are shown in Table 3 and FIG. 3.

TABLE 3

| Example No. | Laminate | MTF [N] | MTS [%] |
| --- | --- | --- | --- |
| CE 1 | A (w/o incisions, MD) | 471.14 | 10.24 |
| CE 2 | A (w/o incisions, CD) | 398.24 | 10.56 |
| CE 3 | B (w/o incisions, MD) | 367.2 | 9.31 |
| CE 4 | B (w/o incisions, CD) | 300.25 | 8.16 |
| 4 | A (with incisions, MD) | 33.13 | 55.24 |
| 5 | A (with incisions, CD) | 33.74 | 57.24 |
| 6 | B (with incisions, MD) | 16.20 | 46.87 |
| 7 | B (with incisions, CD) | 19.04 | 54.01 |

It has been shown that the laminates according to the present invention have significantly lower values in terms of maximum stress and significantly higher values in terms of strain before reaching the maximum tensile strain. This applies to both the machine direction and the cross-machine direction. The laminates of the invention thus have high stretchability at low force application in more than one spatial direction. In combination with good electromagnetic shielding ability, they are advantageously suitable for the production of shielded components even with complex shapes.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A,

The invention claimed is:

1. A flexible laminate for shielding against electromagnetic radiation, comprising:
   a) at least one metal foil; and
   b) a sheet-like substrate comprising a fiber material, film material, or foam material,
   wherein the laminate comprises a plurality of objects formed by incisions into a base area of the laminate,
   wherein each object of the plurality of objects comprises two or more incisions having a common initial point, and wherein the two or more incisions, or each of two adjacent incisions of the two or more incisions, define an angle of 45° to 160°, and wherein each incision of the two or more incisions completely perforates the at least one metal foil and completely perforates the sheet-like substrate.

2. The laminate of claim 1, wherein each object comprises two or more straight incisions.

3. The laminate of claim 1, wherein each object is formed of 2, 3, 4, 5, or 6 incisions.

4. The laminate of claim 1, wherein each object is formed of x incisions, wherein x is 3, 4, 5, or 6, and wherein each of two adjacent incisions define an angle of $(360/x)°+/-20°$.

5. The laminate of claim 1, wherein all objects of the plurality of objects have a type of symmetry comprising:

at least three-fold rotational symmetry, axis symmetry having at least two reflection symmetry axes, an inversion center, or at least three-fold rotational symmetry axis.

6. The laminate of claim 1, wherein the objects form groups, and wherein all objects of a group have identical shape, size, and spatial arrangement, and common initial points of all objects of one group are on a straight line.

7. The laminate of claim 6, wherein the groups form a pattern, and wherein the pattern comprises 1, 2, 3, 4, or more than 4 groups of objects; all straight lines on which the objects lie are arranged in parallel; and the groups have a regular sequence in a direction orthogonal to the straight line.

8. The laminate of claim 1, wherein all objects have identical shape and size.

9. The laminate of claim 1, wherein a length of the incisions is in a range from 1 mm to 40 mm.

10. The laminate of claim 1, wherein a minimum distance between two objects is in a range from 0.1 mm to 15 mm.

11. The laminate of claim 1, wherein the metal foil comprises aluminum.

12. The laminate of claim 1, wherein the metal foil has a thickness of 3 µm to 250 µm (micrometers).

13. The laminate of claim 1, wherein the substrate b) comprises a one- or more-layered fiber material comprising one- or two-layer non-woven fabrics.

14. The laminate of claim 1, wherein the substrate b) has a thickness from 50 µm to 1500 µm.

15. The laminate of claim 1, wherein the laminate has a tear propagation strength, determined in accordance with DIN EN ISO 9073-4:1997-07, in a range of 1 to 100 N.

16. An electromagnetically shielded component, comprising:

at least one laminate of claim 1.

17. A method for producing a component shielded against electromagnetic radiation, the method comprising:

i.1) providing the laminate of claim 1 and at least one polymer material (c) or a precursor thereof; and ii.1) subjecting the laminate and the polymer material (c) or the precursor thereof to forming while bonding the materials, and thereby, if present, bringing the precursor to polymerization, or i.2) providing the laminate of claim 1 and at least one component; and ii.2) partially or completely coating or sheathing the component with the laminate.

18. The method of claim 17, wherein the polymer component of the polymer material (c) is selected from a group consisting of: polyurethanes, silicones, fluorosilicones, polycarbonates, ethylene-vinyl acetates, acrylonitrile butadiene acrylates, acrylonitrile butadiene rubbers, acrylonitrile butadiene styrenes, acrylonitrile methyl methacrylates, acrylonitrile styrene acrylates, cellulose acetates, cellulose acetate butyrates, polysulfones, poly(meth)acrylates, polyvinylchlorides, polyphenylene ethers, polystyrenes, polyamides, polyolefins, polketones, polyetherketones, polyimides, polyetherimides, polyethylene terephthalates, polybutylene terephthalates, fluoropolymers, polyesters, polyacetals, liquid crystal polymers, polyethersulfones, epoxy resins, phenole resins, chlorosulfonates, polybutadienes, polybutyls, polyneoprenes, polynitriles, polyisoprenes, natural rubbers, styrene isoprene styrenes, styrene butadiene styrenes, ethylene propylenes, ethylene propylene diene rubbers, styrene butadiene rubbers, and their copolymers and mixtures thereof.

19. The method of claim 17, wherein, in step i.1), the polymer material (c) is provided in a form of a composite material comprising the polymer component of the polymer material (c) and at least one further component (K).

20. The method of claim 17, wherein, in step i.1), the polymer material (c) is provided in a form of a composite material comprising at least one fibrous reinforcing material.

21. The method of claim 17, wherein, in step i.1), the polymer material (c) is provided in a form of a composite material comprising a fibrous reinforcing material embedded in a thermoplastic material matrix.

22. The method of claim 17, wherein the method is used for shielding against electromagnetic radiation, power-conducting systems and power stores.

23. The method of claim 22, wherein the method is used for shielding against electromagnetic radiation in fields of power electronics, a battery, an electric motor, and for shielding navigation and communication equipment.

* * * * *